United States Patent
Hsu et al.

(10) Patent No.: US 12,199,160 B2
(45) Date of Patent: Jan. 14, 2025

(54) MEMORY CELL OF CHARGE-TRAPPING NON-VOLATILE MEMORY

(71) Applicant: eMemory Technology Inc., Hsin-chu (TW)

(72) Inventors: Chia-Jung Hsu, Hsinchu County (TW); Wein-Town Sun, Hsinchu County (TW)

(73) Assignee: EMEMORY TECHNOLOGY INC., Hsinchu (TW)

( * ) Notice: Subject to any disclaimer, the term of this patent is extended or adjusted under 35 U.S.C. 154(b) by 269 days.

(21) Appl. No.: 18/079,081

(22) Filed: Dec. 12, 2022

(65) Prior Publication Data
US 2023/0197808 A1 Jun. 22, 2023

Related U.S. Application Data

(60) Provisional application No. 63/361,376, filed on Dec. 16, 2021.

(51) Int. Cl.
*G11C 16/04* (2006.01)
*G11C 16/14* (2006.01)
(Continued)

(52) U.S. Cl.
CPC ...... *H01L 29/4234* (2013.01); *G11C 16/0466* (2013.01); *G11C 16/14* (2013.01);
(Continued)

(58) Field of Classification Search
CPC ..... G11C 16/0466; G11C 16/14; G11C 16/26; G11C 16/0433; G11C 16/10; H01L 29/4234; H01L 29/7833; H01L 29/792; H01L 29/40117; H01L 29/66833; H01L 29/0847; H01L 29/1083; H01L 29/66659; H01L 29/7835; H10B 43/10; H10B 43/30
See application file for complete search history.

(56) References Cited

U.S. PATENT DOCUMENTS 8,022,465 B2 * 9/2011 Shih ............... H01L 29/518
257/314
8,482,052 B2 * 7/2013 Lue ............... H01L 29/66833
257/314
(Continued)

OTHER PUBLICATIONS

Tsai et al. "A study of gateless OTP cell using a 45nm CMOS compatible process", Dec. 31, 2008, Elsevier.

*Primary Examiner* — Hien N Nguyen
(74) *Attorney, Agent, or Firm* — WPAT, PC

(57) ABSTRACT

A memory cell of a charge-trapping non-volatile memory includes a semiconductor substrate, a well region, a first doped region, a second doped region, a gate structure, a protecting layer, a charge trapping layer, a dielectric layer, a first conducting line and a second conducting line. The first doped region and the second doped region are formed under a surface of the well region. The gate structure is formed over the surface of the well region. The protecting layer formed on the surface of the well region. The charge trapping layer covers the surface of the well region, the gate structure and the protecting layer. The dielectric layer covers the charge trapping layer. The first conducting line is connected with the first doped region. The second conducting line is connected with the second doped region.

22 Claims, 5 Drawing Sheets

(51) Int. Cl.
  *G11C 16/26* (2006.01)
  *H01L 29/423* (2006.01)
  *H01L 29/78* (2006.01)
  *H01L 29/792* (2006.01)
  *H10B 43/10* (2023.01)
  *H10B 43/30* (2023.01)
  *H01L 21/28* (2006.01)
  *H01L 29/66* (2006.01)

(52) U.S. Cl.
  CPC .......... *G11C 16/26* (2013.01); *H01L 29/7833* (2013.01); *H01L 29/792* (2013.01); *H10B 43/10* (2023.02); *H10B 43/30* (2023.02); *H01L 29/40117* (2019.08); *H01L 29/66833* (2013.01)

(56) References Cited

U.S. PATENT DOCUMENTS

| | | | | |
|---|---|---|---|---|
| 2008/0266944 | A1* | 10/2008 | Chen | G11C 16/0433 257/E21.21 |
| 2009/0065841 | A1* | 3/2009 | Shappir | H01L 29/7923 257/315 |
| 2022/0085038 | A1* | 3/2022 | Chen | H01L 29/7881 |

* cited by examiner

MEMORY CELL OF CHARGE-TRAPPING NON-VOLATILE MEMORY

This application claims the benefit of U.S. provisional application Ser. No. 63/361,376, filed Dec. 16, 2021, the subject matters of which are incorporated herein by references.

FIELD OF THE INVENTION

The present invention relates to a memory cell of a non-volatile memory, and more particularly to a memory cell of a charge-trapping non-volatile memory and a gate structure of the memory cell.

BACKGROUND OF THE INVENTION

Non-volatile memories have been widely used in a variety of electronic products. After the supplied power is interrupted, the data stored in the non-volatile memory is still retained.

FIG. 1 is a schematic cross-sectional view illustrating a memory cell of a conventional charge-trapping non-volatile memory. As shown in FIG. 1, a P-well region PW is formed in a semiconductor substrate. Moreover, three doped regions 101, 103 and 105 are formed in the P-well region PW. The three doped regions 101, 103 and 105 are n-type doped regions. A gate structure 110 is formed over the surface of the P-well region PW between the doped regions 101 and 103, and another gate structure 120 is formed over the surface of the P-well region PW between the doped regions 103 and 105. As shown in FIG. 1, the three doped regions 101, 103 and 105 include lightly doped drain regions (LDD regions) 101a, 103a, 103b and 105a formed under spacers 116 and 129 of the two gate structures 110 and 120.

The gate structure 110 comprises a gate dielectric layer 112, a gate layer 114 and a spacer 116. The spacer 116 is arranged around or beside the sidewall(s) of the gate dielectric layer 112 and the gate layer 114. The gate oxide layer 112 is made of silicon dioxide ($SiO_2$). The gate layer 114 is made of polysilicon.

The gate structure 120 comprises a tunneling layer 122, a trapping layer 124, a blocking layer 126, a gate layer 128 and a spacer 129. The spacer 129 is arranged around or beside the sidewall(s) of the tunneling layer 122, the trapping layer 124, the blocking layer 126 and the gate layer 128. The tunneling layer 122 and the blocking layer 126 are made of silicon dioxide. The trapping layer 124 is made of silicon nitride (SiN). The gate layer 128 is made of polysilicon.

Please refer to FIG. 1 again. The P-well region PW, the doped region 101, the doped region 103 and the gate structure 110 are collaboratively formed as a switch transistor Msw. The P-well region PW, the doped region 103, the doped region 105 and the gate structure 120 are collaboratively formed as a storage transistor Ms. In other words, the memory cell comprises a switch transistor Msw and a storage transistor Ms. The switch transistor Msw and the storage transistor Ms are n-type transistors.

For example, in case that no charges are stored in the trapping layer 124 of the storage transistor Ms, the memory cell is in a first storage state. Whereas, in case that charges are stored in the trapping layer 124 of the storage transistor Ms, the memory cell is in a second storage state.

When a program action is performed on the memory cell, proper bias voltages are provided to the gate layer 114, the gate layer 128, the doped region 101, the doped region 105 and the P-well region PW. Consequently, the memory cell generates a program current $I_P$. When the program current $I_P$ flows through a channel region of the storage transistor Ms, charges (e.g., electrons) are transmitted from the channel region of the storage transistor Ms to the trapping layer 124 through the tunneling layer 122. Consequently, the storage state of the memory cell is changed from the first storage state to the second storage state.

When an erase action is performed on the memory cell, proper bias voltages are provided to the gate layer 114, the gate layer 128, the doped region 101, the doped region 105 and the P-well region PW. Consequently, the charges (e.g., electrons) stored in the trapping layer 124 are ejected to the P-well region PW through the tunneling layer 122. Under this circumstance, the storage state of the memory cell is changed from the second storage state to the first storage state.

As mentioned above, the memory cell of the conventional charge-trapping non-volatile memory comprises two complete transistors. Consequently, this memory cell is also referred as a 2T cell.

SUMMARY OF THE INVENTION

An embodiment of the present invention provides a memory cell of a charge-trapping non-volatile memory. The memory cell includes a semiconductor substrate, a well region, a first doped region, a second doped region, a gate structure, a protecting layer, a charge trapping layer, a dielectric layer, a first conducting line and a second conducting line. The well region is formed in the semiconductor substrate. The first doped region and the second doped region are formed under a surface of the well region. The gate structure is formed over the surface of the well region. The protecting layer formed on the surface of the well region. The first doped region is located beside a first side of the gate structure and formed under the surface of the well region. A first side of the protecting layer is contacted with a second side of the gate structure. The second doped region is located beside a second side of the protecting layer and formed under the surface of the well region. The charge trapping layer covers the surface of the well region, the gate structure and the protecting layer. The dielectric layer covers the charge trapping layer. The first conducting line is connected with the first doped region. The second conducting line is connected with the second doped region.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 2A:
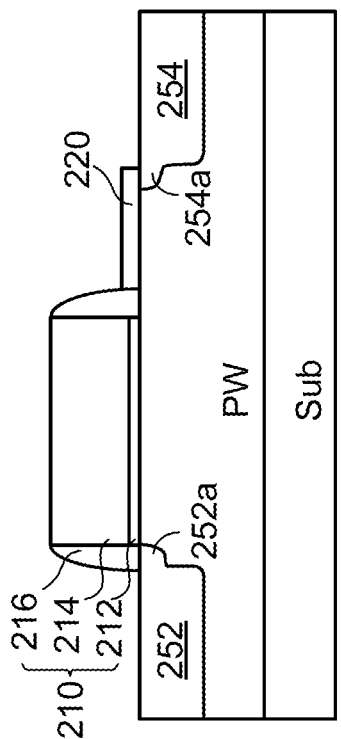
FIGS. 2A, 2B and 2C are schematic cross-sectional views illustrating a method of manufacturing a memory cell of a charge-trapping non-volatile memory according to a first embodiment of the present invention.
Figure 2C:
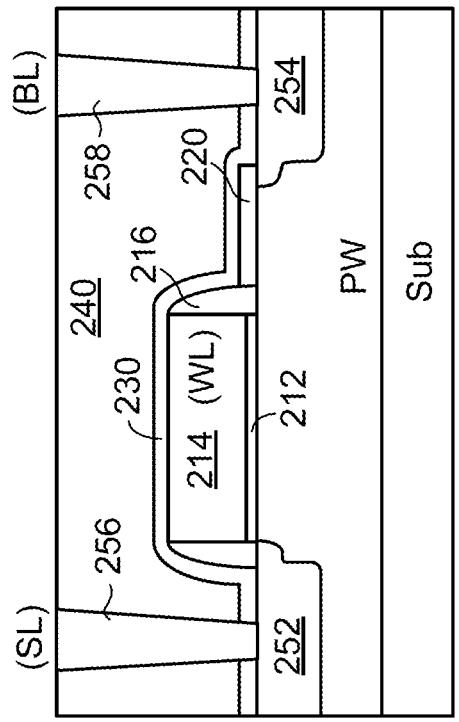
Figure 1:
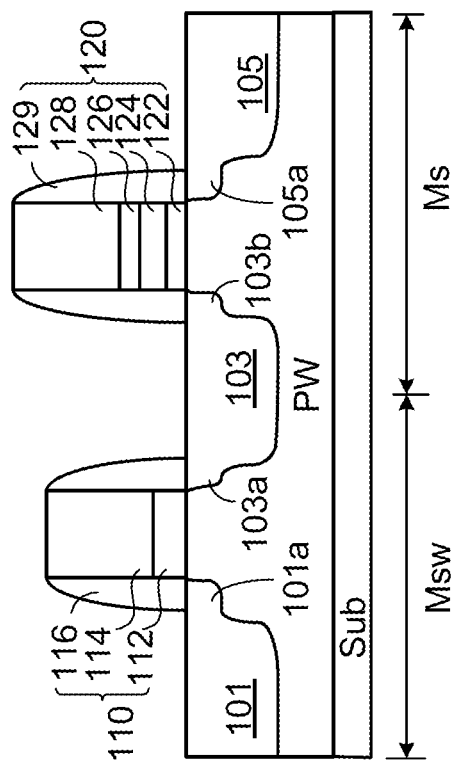
FIG. 1 (prior art) is a schematic cross-sectional view illustrating a memory cell of a conventional charge-trapping non-volatile memory.
Figure 2B:
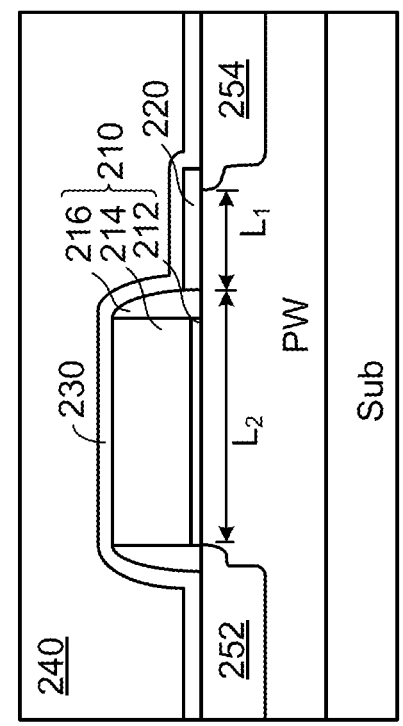

FIGS. 2A, 2B and 2C are schematic cross-sectional views illustrating a method of manufacturing a memory cell of a charge-trapping non-volatile memory according to a first embodiment of the present invention.

Please refer to FIG. 2A. Firstly, a gate structure 210 is formed over the surface of a P-well region PW of a semiconductor substrate Sub. The gate structure 210 covers the surface of the P-well region PW. Moreover, the gate structure 210 comprises a gate oxide layer 212, a gate layer 214 and a spacer 216. The gate oxide layer 212 covers the surface of the P-well region PW. The gate layer 214 covers the gate oxide layer 212. The spacer 216 is arranged around or beside the sidewall(s) of the gate oxide layer 212 and the gate layer 214.

Then, a protecting layer 220 is formed over the surface of the P-well region PW. The protecting layer 220 is contacted with the surface of the P-well region PW and a side of the gate structure 210. The protecting layer 220 is made of oxide. The protecting layer 220 is a salicide block layer (also referred as a SAB layer) or a resist protect oxide layer (also referred as a RPO layer). The thickness of protecting layer 220 is in a range between 50 and 500 angstroms (Å).

Then, two n-type doped regions 252 and 254 are formed in the P-well region PW. The n-type doped region 252 is located beside a first side of the gate structure 210 and formed under the surface of the P-well region PW. A first side of the protecting layer 220 is contacted with a second side of the gate structure 210. The n-type doped region 254 is located beside a second side of the protecting layer 220 and formed under the surface of the P-well region PW. As shown in FIG. 2A, the two doped regions 252 and 254 further include LDD regions 252a and 254a. In addition, the LDD region 254a may be selectively formed in the doped region 254 according to actual requirements.

Please refer to FIG. 2B. Then, a contact etch stop layer (also referred as a CESL layer) 230 and an interlayer dielectric layer (also referred as an IDL layer) 240 are formed sequentially. The CESL layer 230 covers the surface of the P-well region PW, the gate structure 210 and the protecting layer 220. The IDL layer 240 covers the CESL layer 230. The CESL layer 230 includes nitride material such as silicon nitride ($Si_3N_4$) or silicon oxynitride (SiON). The IDL layer 240 is made of oxide such as silicon dioxide ($SiO_2$). The thickness of the CESL layer 230 is in the range between 200 and 500 angstroms (Å).

Please refer to FIG. 2B again. In the P-well region PW, the area between the n-doped region 252 and the n-doped region 254 is a channel region. The channel region is divided into a first-part channel region and a second-part channel region. The first-part channel region is located under the protecting layer 220. The area of the channel region excluding the first-part channel region is the second-part channel region. For example, the area under the protecting layer 220 is the first-part channel region, and the area under the gate structure 210 is the second-part channel region.

The first-part channel region is contacted with the surface of the P-well region PW. The length of the first-part channel region is equal to $L_1$. In addition, the length of the gate structure 210 is approximately equal to the length of the second-part channel region. The length of the second-part channel region is equal to $L_2$. Moreover, the relationship between the length $L_1$ and the length $L_2$ may be expressed as: $L_2/3 < L_1 < L_2/2$. That is, the length $L_1$ of the protecting layer 220 contacted with the surface of the P-well region PW is in a range between ⅓ and ½ of the length $L_2$ of the gate structure 210. For example, the length $L_2$ of the second-part channel region is 0.5 μm, and the length $L_1$ of the first-part channel region is between 0.18 μm and 0.2 μm.

Please refer to FIG. 2C. Then, the IDL layer 240 and the CESL layer 230 are etched to form contact holes over the n-doped regions 252 and 254. After a metallic material is filled into the contact holes, two conducting lines 256 and 258 are formed. Consequently, the conducting lines 256 and 258 are connected with the n-doped regions 252 and 254, respectively. Moreover, the conducting line 256 is served as a source line SL, the conducting line 258 is served as a bit line BL, and the gate layer 214 is served a word line WL.

In the memory cell of the first embodiment, the protecting layer 220 is made of oxide, the CESL layer 230 is made of nitride, and the IDL layer 240 is made of oxide. That is, the protecting layer 220, the CESL layer 230 and the IDL layer 240 are collaboratively formed as an oxide/nitride/oxide (O/N/O) storage structure over the first-part channel region. The CESL layer 230 is served as a charge trapping layer. When a program action is performed, the carriers (e.g., electrons or holes) are controlled to be injected into the charge trapping layer (i.e., the CESL layer 230) of the storage structure through the channel region. Consequently, the memory cell is programmed to a first storage state or a second storage state. The associated operating principles will be described in more details as follows.

Figure 3A:
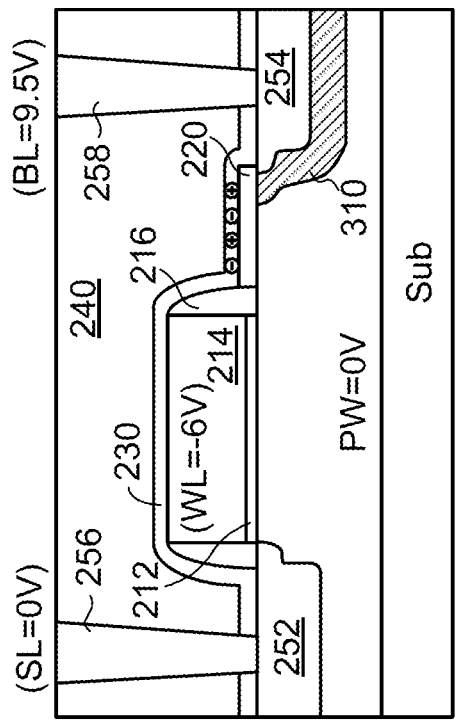
FIG. 3A schematically illustrates the bias voltages of performing a program action on the memory cell according to the first embodiment of the present invention.
Figure 3B:
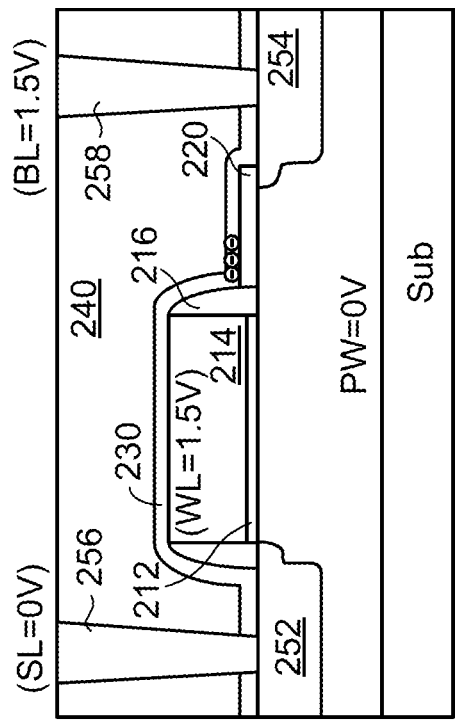
FIG. 3B schematically illustrates the bias voltages of performing an erase action on the memory cell according to the first embodiment of the present invention.
Figure 3C:
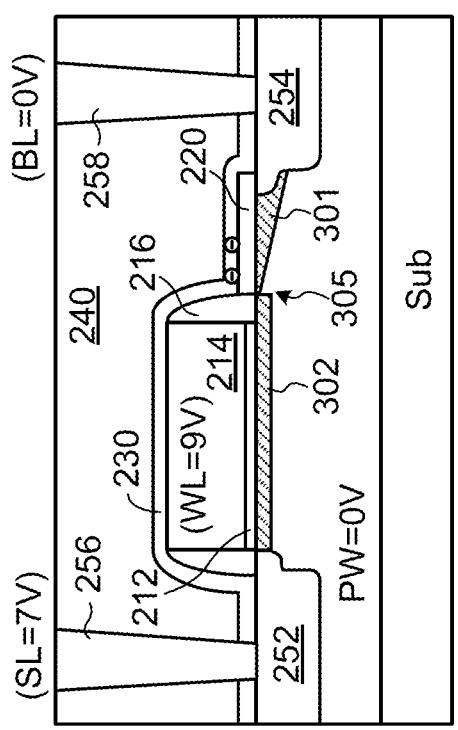
FIGS. 3C and 3D schematically illustrate the bias voltages of performing read actions on the memory cell according to the first embodiment of the present invention.
Figure 3D:
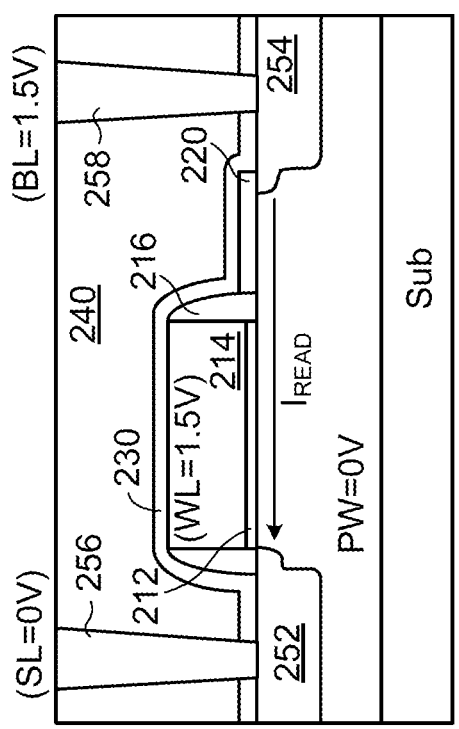

FIG. 3A schematically illustrates the bias voltages of performing a program action on the memory cell according to the first embodiment of the present invention. FIG. 3B schematically illustrates the bias voltages of performing an erase action on the memory cell according to the first embodiment of the present invention. FIGS. 3C and 3D schematically illustrate the bias voltages of performing read actions on the memory cell according to the first embodiment of the present invention. For example, in case that electrons are not stored in the CESL layer 230, the memory cell is in the first storage state. Whereas, in case that electrons are stored in the CESL layer 230, the memory cell is in the second storage state.

Please refer to FIG. 3A. When the program action is performed, the source line SL receives a program voltage, the word line WL receives a gate voltage, the bit line BL receive a ground voltage, and the P-well region PW receives the ground voltage. The magnitude of the gate voltage can be equal to or higher than the magnitude of the program voltage, and the magnitude of the program voltage is higher than the magnitude of the ground voltage. Consequently, a program current is generated by the memory cell. The program current flows from the n-doped region 252 to the n-type doped region 254 through the channel region. For example, the program voltage is 7V, the gate voltage is 9V, and the ground voltage is 0V.

Please refer to FIG. 3A again. After the word line WL receives the gate voltage, the second-part channel region 302 is turned on, and the program voltage (e.g., 7V) received by the source line SL is transmitted to the second-part channel region 302. Moreover, the voltage at a terminal of the first-part channel region 301 is equal to the ground voltage, and the voltage at the other terminal of the first-part channel region 301 (e.g., a pinch off point 305) is equal to or nearly equal to the program voltage (e.g., 7V). Consequently, the junction between the first-part channel region 301 and the second-part channel region 302 is pinched off. Under this circumstance, electrons are injected from the pinch off point 305 into the CESL layer 230 through the protecting layer 220. That is, when the program action is performed, the storage state of the memory cell is changed from the first storage state to the second storage state.

Please refer to FIG. 3B. When the erase action is performed, the source line SL and the P-well region PW receives the ground voltage, the bit line BL receives a positive voltage (e.g., 9.5V), and the word line WL receives a negative voltage (e.g., −6V). The positive voltage is an erase voltage.

Please refer to FIG. 3B again. Since the P-well region PW receives the ground voltage and the n-doped region 254 receives the positive voltage (e.g., 9.5V), the p-n junction between the P-well region PW and n-doped region 254 is reverse biased and a wider depletion region 310 is formed. That is, the depletion region 310 is increased. Consequently, a large number of electron-hole pairs are generated. Moreover, since the word line WL (i.e., the gate layer 214) receives the negative voltage, the holes are attracted by the gate layer 214. Under this circumstance, a gate-enhanced avalanche hot hole injection effect (also referred as a GE AHHI effect) is generated. Consequently, holes are injected into the CESL layer 230 through the protecting layer 220, and an electron-hole recombination process occurs in the CESL layer 230. That is, when the erase action is performed, the storage state of the memory cell is changed from the second storage state to the first storage state.

Please refer to FIGS. 3C and 3D. When the read action is performed, the source line SL receives the ground voltage, the word line WL receives an on voltage, the bit line BL receives a read voltage, and the P-well region PW receives the ground voltage. For example, the read voltage is 1.5V, the on voltage is 1.5V, and the ground voltage is 0V. The on voltage should be higher than the ground voltage by at least a threshold voltage to ensure that a read current $I_{READ}$ can be generated. The read voltage is higher than the ground voltage, and is not necessarily equal to the on voltage.

As shown in FIG. 3C, there are no electrons stored in the CESL layer 230 of the memory cell. When the word line WL receives the on voltage, the channel region between the n-doped regions 252 and 254 generates a higher read current $I_{READ}$. The read current $I_{READ}$ flows from the bit line BL to the source line SL.

As shown in FIG. 3D, there are electrons stored in the CESL layer 230 of the memory cell. Consequently, the first-part channel region is turned off. When the word line WL receives the on voltage, the channel region between the n-doped regions 252 and 254 does not generate the read current $I_{READ}$. That is, the magnitude of the read current $I_{READ}$ is nearly zero.

When the read action is performed, the storage state of the memory cell can be determined according to the magnitude of the read current $I_{READ}$. For example, a reference current is provided. If the magnitude of the read current $I_{READ}$ is higher than the magnitude of the reference current, the memory cell is determined to be in the first storage state. Whereas, if the magnitude of the read current $I_{READ}$ is lower than the magnitude of the reference current, the memory cell is determined to be in the second storage state.

In the first embodiment, the n-doped regions 252 and 254 are formed in the P-well region PW. In another embodiment, a memory cell of a charge-trapping non-volatile memory may include the p-doped regions formed in the N-well region NW.

Figure 4:
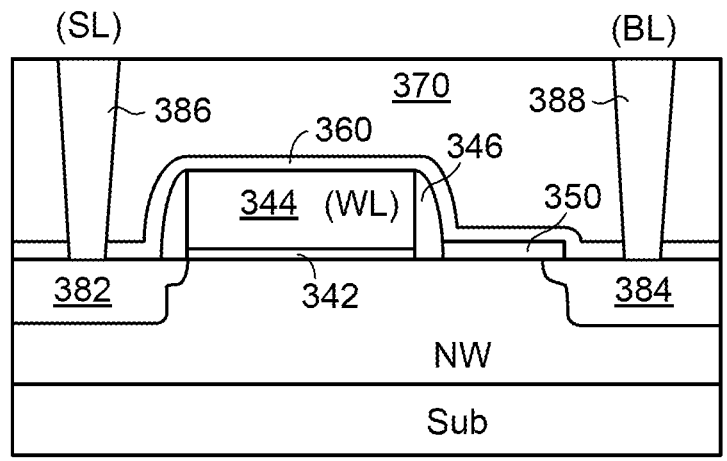
FIG. 4 is a schematic cross-sectional view illustrating a memory cell of a charge-trapping non-volatile memory according to a second embodiment of the present invention.

FIG. 4 shows a memory cell of a charge-trapping non-volatile memory according to a second embodiment of the present invention.

A gate structure including a gate oxide layer 342, a gate layer 344 and a spacer 346 is formed over the surface of a N-well region NW of a semiconductor substrate Sub. The gate structure covers the surface of the N-well region NW. A protecting layer 350 is formed over the surface of the N-well region NW. The protecting layer 350 is contacted with the surface of the N-well region NW and a side of the gate structure.

Two p-type doped regions 382 and 384 are formed in the N-well region NW. The p-type doped region 382 is located beside a first side of the gate structure and formed under the surface of the N-well region. A first side of the protecting layer 350 is contacted with a second side of the gate structure. The p-type doped region 384 is located beside a second side of the protecting layer 350 and formed under the surface of the N-well region NW. The two doped regions 382 and 384 may further include LDD regions 252a and 254a as shown in FIG. 2A.

A CESL layer 360 and an IDL layer 370 are formed sequentially. The CESL layer 360 covers the surface of the N-well region NW, the gate structure and the protecting layer 350. The IDL layer 370 covers the CESL layer 360. Moreover, the IDL layer 370 and the CESL layer 360 are etched to form contact holes over the p-doped regions 382 and 384. After a metallic material is filled into the contact holes, two conducting lines 386 and 388 are formed. Consequently, the conducting lines 386 and 388 are connected with the p-doped regions 382 and 384, respectively. Moreover, the conducting line 386 is served as a source line SL, the conducting line 388 is served as a bit line BL, and the gate layer 344 is served a word line WL.

The area between the p-doped region 382 and the p-doped region 384 is a channel region. The channel region is divided into a first-part channel region and a second-part channel region. The first-part channel region is located under the protecting layer 350. The area of the channel region excluding the first-part channel region is the second-part channel region. For example, the area under the protecting layer 350 is the first-part channel region, and the area under the gate structure is the second-part channel region. The length of the first-part channel region is equal to $L_1$. The length of the second-part channel region is equal to $L_2$. Moreover, the relationship between the length $L_1$ and the length $L_2$ may be expressed as: $L_2/3<L_1<L_2/2$.

The materials and the thicknesses of the gate structure, the protecting layer 350, the CESL layer 360 and the IDL layer 370 in the memory cell of the second embodiment are similar to those of the memory cell of the first embodiment, and not redundantly described herein.

Similarly, a program action, an erase action and a read action can be performed on the memory cell. When the program action is performed, the source line SL receives a program voltage, the word line WL receives a gate voltage, the bit line BL receive a ground voltage, and the N-well region NW receives the program voltage. The storage state of the memory cell is changed from the first storage state to the second storage state.

According to the second embodiment of the present invention, the magnitude of the gate voltage should be less than the magnitude of the program voltage, preferably less than half the magnitude of the program voltage. For example, the program voltage is 7V, the gate voltage is 3.5V, and the ground voltage is 0V.

When the erase action is performed, the source line SL and the bit line BL and the word line WL receive a ground voltage, and the N-well region NW receives the positive voltage. The positive voltage is an erase voltage. The storage state of the memory cell is changed from the second storage state to the first storage state after the erase action.

According to the second embodiment of the present invention, the magnitude of the voltage received by the word line WL should be less than or equal to the magnitude of the ground voltage. For example, the erase voltage is 9.5V and the ground voltage is 0V.

When the read action is performed, the source line SL receives a read voltage, the word line WL receives an on voltage, the bit line BL receives a ground voltage, and the N-well region NW receives the read voltage. The storage state of the memory cell can be determined according to the magnitude of the read current after the read action.

According to the second embodiment of the present invention, the magnitude of the on voltage should be less than the magnitude of the read voltage minus a threshold voltage. For example, the read voltage is 1.5V and the on voltage is 0V.

Figure 5A:
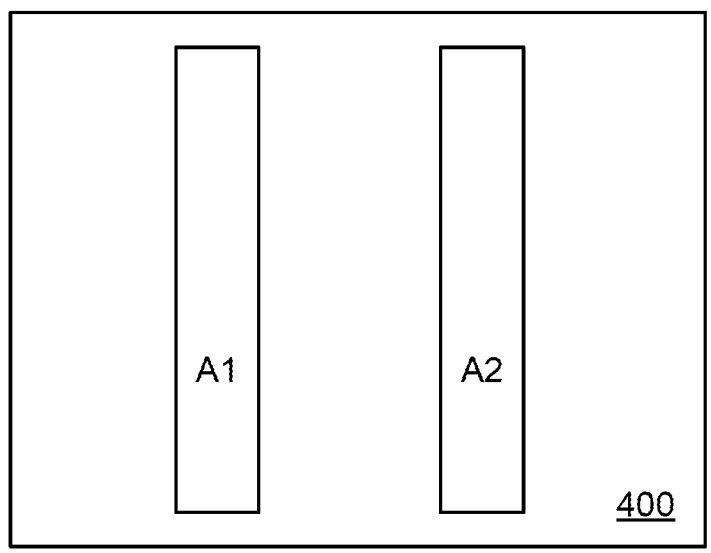
FIGS. 5A, 5B and 5C are schematic top views illustrating a memory cell array with plural memory cells of the first embodiment.
Figure 5B:
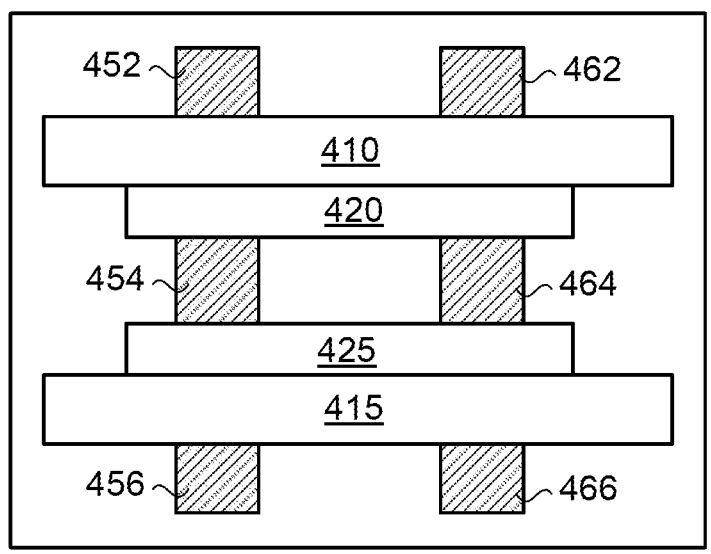
Figure 5C:
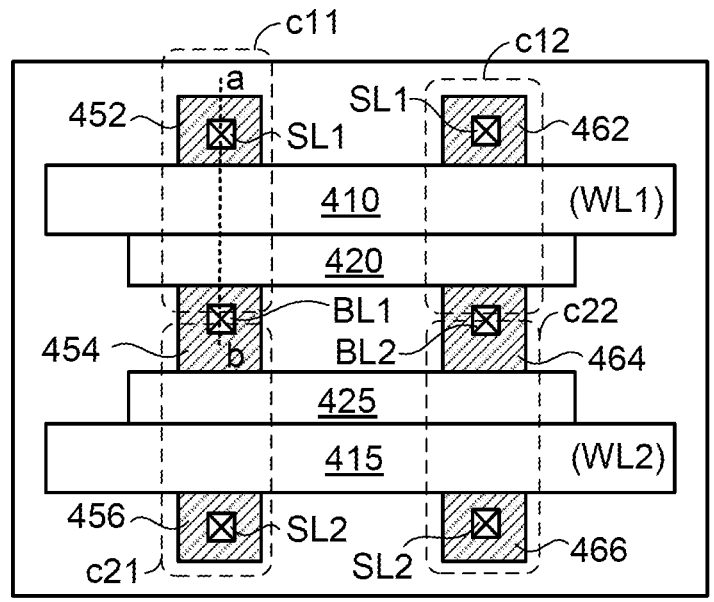

Moreover, plural non-volatile memory cells of the first embodiment or the second embodiment can be combined as a memory cell array. FIGS. 5A, 5B and 5C are schematic top views illustrating a memory cell array with plural memory cells of the first embodiment. The memory cell array comprises m×n memory cells, wherein m and n are positive integers. For illustration, the memory cell array of this embodiment comprises 2×2 memory cells c11~c22.

Please refer to FIG. 5A. Firstly, the area over the surface of a P-well region PW is divided into two regions A1 and A2 through an isolation structure 400. That is, the surface of the semiconductor substrate is covered by the isolation structure 400, and the surface of the P-well region PW are exposed through the two regions A1 and A2 only. In an embodiment, the isolation structure 400 is a shallow trench isolation (STI) structure.

Please refer to FIG. 5B. Then, two gate structures 410 and 415 are formed. The two gate structures 410 and 415 cover both of the two regions A1 and A2. Moreover, two protecting layers 420 and 425 are formed. The protecting layer 420 is contacted with a side of the gate structure 410. Moreover, the protecting layer 420 covers the two regions A1 and A2.

The protecting layer 425 is contacted with a side of the gate structure 415. Moreover, and the protecting layer 425 covers the second regions A1 and A2.

Then, a doping process is performed. Consequently, the areas of the two regions A1 and A2 uncovered by the gate structures 410 and 415 and the protecting layers 420 and 425 are formed as n-doped regions 452, 454, 456, 462, 464 and 466. Then, a CESL layer and an IDL layer are sequentially formed over the resulting structure.

Please refer to FIG. 5C. Then, the IDL layer and the CESL layer are etched to form contact holes over the n-doped region 452, 454, 456, 462, 464 and 466, respectively. Then, a metallic material is filled into the contact holes, and thus plural conducting lines are formed. The conducting lines are served as source lines SL1, SL2 and bit lines BL1, BL2. The source line SL1 is connected with the n-doped regions 452 and 462. The source line SL2 is connected with the n-doped regions 456 and 466. The bit line BL1 is connected with the n-doped region 454. The bit line BL2 is connected with the n-doped region 464. Moreover, a gate layer of the gate structure 410 is served as a word line WL1, and a gate layer of the gate structure 415 is served as a word line WL2. In some embodiments, the source lines SL1 and SL2 are connected with each other.

After the above steps are completed, the memory cell array is produced. The memory cell array of this embodiment comprises 2×2 memory cells c11~c22. The cross-sectional structure of the memory cell c11 along the dotted line a-b is similar to that of FIG. 2C, and not redundantly described herein.

From the above descriptions, the present invention provides a memory cell of a charge-trapping non-volatile memory. The memory cell comprises a transistor and a storage structure. Since the storage structure is similar to an incomplete transistor, the memory cell can be referred as a 1.5 T cell.

Figure 6A:
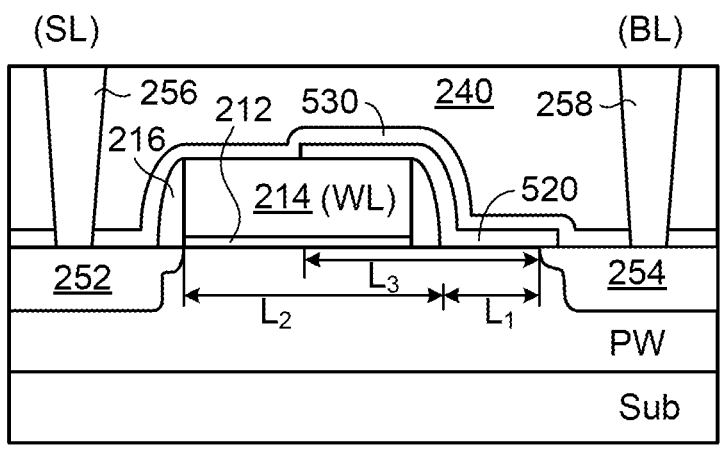
FIG. 6A is a schematic cross-sectional view illustrating a memory cell of a charge-trapping non-volatile memory according to a third embodiment of the present invention.
Figure 6B:
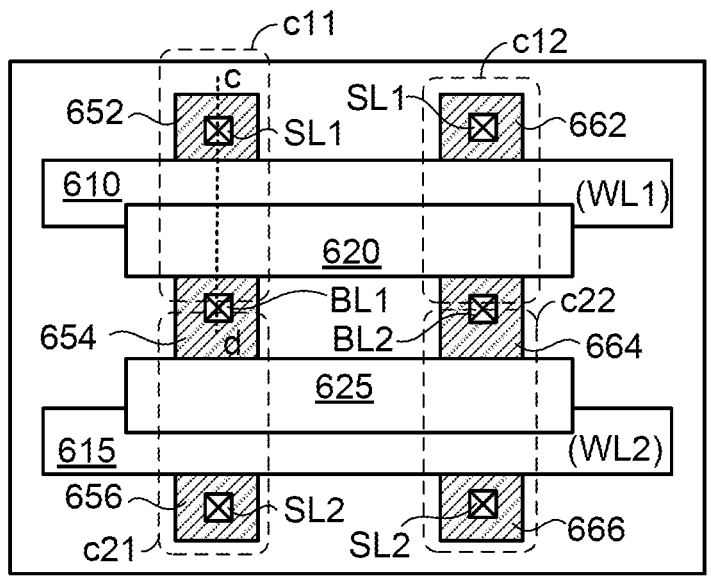
FIG. 6B is a schematic top view illustrating a memory cell array with plural memory cells of the third embodiment.

Moreover, the structures of the protecting layer may be properly modified. Please refer to FIGS. 6A and 6B. FIG. 6A is a schematic cross-sectional view illustrating a memory cell of a charge-trapping non-volatile memory according to a third embodiment of the present invention. FIG. 6B is a schematic top view illustrating a memory cell array with plural memory cells of the third embodiment. In comparison with the memory cell of FIG. 2C, the structures of the protecting layer 520 and the CESL layer in the memory cell of the third embodiment are distinguished.

As shown in FIG. 6A, the protecting layer 520 is contacted with a side of the gate structure. Especially, a portion of the protecting layer 520 is located over the gate structure to cover the gate structure. That is, in the memory cell of the third embodiment, the protecting layer 520 is contacted with the surface of the P-well region PW, and the protecting layer 520 covers a portion of the spacer 216 and a portion of the gate layer 214.

After a doping process is performed to form the n-doped regions 252 and 254, a CESL layer 530 and an IDL layer 240 are formed sequentially. The CESL layer 530 covers the P-well region PW, the gate structure and the protecting layer 520. The IDL layer 240 covers the CESL layer 530. Similarly, the protecting layer 520, the CESL layer 530 and the IDL layer 240 are collaboratively formed as an oxide/nitride/oxide (O/N/O) storage structure over the first-part channel region. The CESL layer 530 is used as a charge trapping layer. When a program action is performed, the carriers (e.g., electrons or holes) are controlled to be injected into the charge trapping layer (i.e., the CESL layer 530) of the storage structure through the channel region. Consequently, the memory cell is programmed to a first storage state or a second storage state.

In this embodiment, a portion of the protecting layer 520 covers the gate structure. Consequently, the length of the first-part channel region can be specially designed. In other words, the program action and the erase action can be effectively performed on the memory cell.

Similarly, the area under the protecting layer 520 and contacted with the surface of the P-well region PW is the first-part channel region. The length of the first-part channel region is equal to $L_1$. The length of the gate structure is approximately equal to the length of the second-part channel region. The length of the second-part channel region is equal to $L_2$. The length of the protecting layer 520 projected on the channel region is $L_3$. Moreover, the relationship between the length $L_1$, length $L_2$ and the length $L_3$ may be expressed as: $L_2/3<L_1<L_2/2$ and $L_2>L_3>L_1$. That is, the length $L_1$ of the protecting layer 520 contacted with the surface of the P-well region PW is in a range between ⅓ and ½ of the length $L_2$ of the gate structure. For example, $L_3=L_1+0.5\times L_2$. That is, the protecting layer 520 covers half the width of the gate layer 214.

The materials and the thicknesses of the gate structure, the protecting layer 520, the CESL layer 530 and the IDL layer 240 in the memory cell of the third embodiment are similar to those of the memory cell of the first embodiment. Similarly, the program action, the erase action and the read action performed on the memory cell of the third embodiment are similar to those of the first embodiment, and not redundantly described herein.

Please refer to FIG. 6B. In the memory cell array, a portion of the gate structure 610 is covered by the protecting layer 620, and a portion of the gate structure 615 is covered by the protecting layer 625. Then, plural n-doped regions 652, 654, 656, 662, 664 and 666 are formed in the P-well region PW. Then, a CESL layer (not shown) and an IDL layer (not shown) are sequentially formed over the resulting structure. Then, plural conducting lines are formed. The conducting lines are served as source lines SL1, SL2 and bit lines BL1, BL2. The source line SL1 is connected with the n-doped regions 651 and 662. The source line SL2 is connected with the n-doped regions 656 and 666. The bit line BL1 is connected with the n-doped region 654. The bit line BL2 is connected with the n-doped region 664. In some embodiments, the source lines SL1 and SL2 are connected with each other.

After the above steps are completed, the memory cell array is produced. The memory cell array of this embodiment comprises 2×2 memory cells c11~c22. The cross-sectional structure of the memory cell c11 along the dotted line c-d is similar to that of FIG. 6A, and not redundantly described herein.

Figure 7:
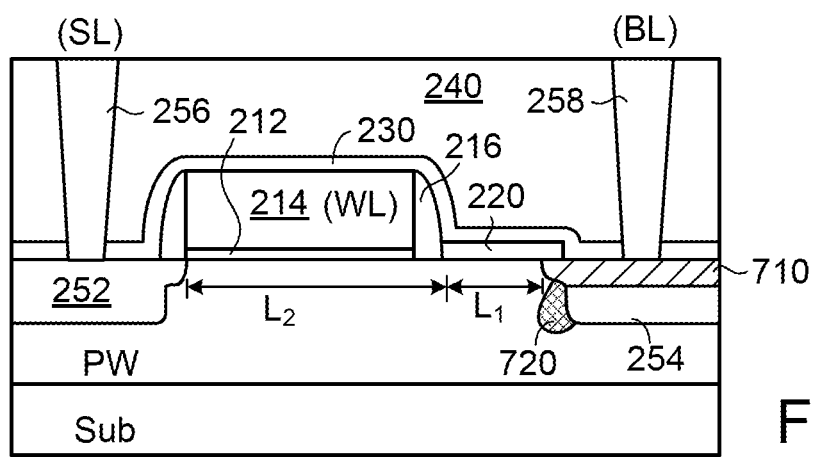
FIG. 7 is a schematic cross-sectional view illustrating a memory cell of a charge-trapping non-volatile memory according to a fourth embodiment of the present invention.

It is noted that numerous modifications and alterations may be made while retaining the teachings of the invention. In another embodiment, the dopant concentration of the n-doped region is increased and a p-halo implant (also known as pocket implant) is added, and thus the efficiency of performing the erase action is enhanced. FIG. 7 is a schematic cross-sectional view illustrating a memory cell of a charge-trapping non-volatile memory according to a fourth embodiment of the present invention. In comparison with the memory cell of the first embodiment as shown in FIG. 2C, the memory cell of this embodiment further comprises an additional n-type lightly doped drain (LDD) region 710 and a p-halo region 720 by using an additional doping process. The additional n-type LDD region 710 is formed over the n-doped region 254. The p-halo region 720 is formed beside the n-doped region 254 and/or the additional n-type LDD region 710.

Since the additional n-type LDD region 710 is formed over the n-doped region 254, the dopant concentration in the area overlying the n-doped region 254 is higher than the dopant concentration of the n-doped region 254. Consequently, when the erase action is performed in response to the reverse bias, more electron-hole pairs are generated in the p-n junction of the p-halo region 720 and the additional n-type LDD region 710. Under this circumstance, the GE AHHI effect is generated. Consequently, holes are injected into the CESL layer 230 through the protecting layer 220, and an electron-hole recombination process occurs in the CESL layer 230. In this way, the erase efficiency of the memory cell is enhanced.

Figure 8:
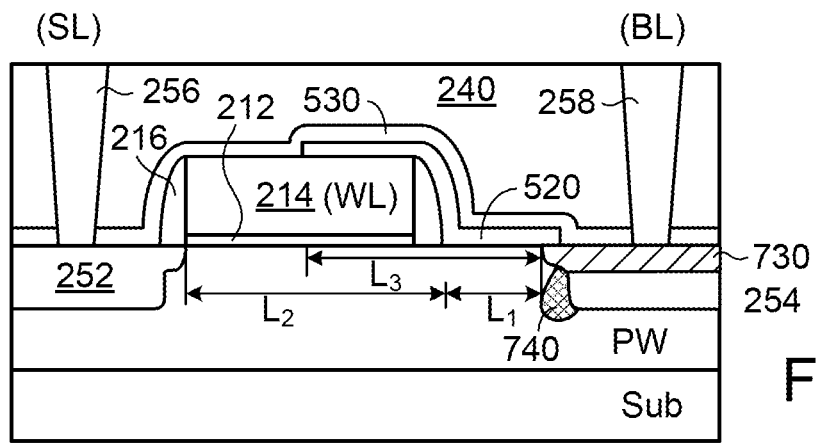
FIG. 8 is a schematic cross-sectional view illustrating a memory cell of a charge-trapping non-volatile memory according to a fifth embodiment of the present invention.

Of course, the concept of the fourth embodiment can be also applied to the third embodiment. FIG. 8 is a schematic cross-sectional view illustrating a memory cell of a charge-trapping non-volatile memory according to a fifth embodiment of the present invention. In comparison with the memory cell of FIG. 6A, the memory cell of the fifth embodiment further includes an additional n-type LDD region 730 and a p-halo region 720. In the memory cell of the fifth embodiment, the additional n-type lightly doped drain (LDD) region 730 is formed over the n-doped region 254 and the p-halo region 740 is formed beside the n-doped region 254 and/or the additional n-type LDD region 730 in order to enhance the erase efficiency of the memory cell.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory cell of a charge-trapping non-volatile memory, the memory cell comprising:
    a semiconductor substrate;
    a well region formed in the semiconductor substrate;
    a first doped region and a second doped region;
    a gate structure formed over a surface of the well region;
    a protecting layer formed on the surface of the well region, wherein the first doped region is located beside a first side of the gate structure and formed under the surface of the well region, a first side of the protecting layer is contacted with a second side of the gate structure, and the second doped region is located beside a second side of the protecting layer and formed under the surface of the well region;
    a charge trapping layer covering the surface of the well region, the gate structure and the protecting layer;
    a dielectric layer covering the charge trapping layer;
    a first conducting line connected with the first doped region; and
    a second conducting line connected with the second doped region.

2. The memory cell as claimed in claim 1, wherein the memory cell further comprises an additional lightly doped drain region, and the additional lightly doped drain region is formed over the second doped region.

3. The memory cell as claimed in claim 2, wherein the memory cell further comprises a halo region formed beside the additional lightly doped drain region.

4. The memory cell as claimed in claim 1, wherein the memory cell further comprises a halo region formed beside the second doped region.

5. The memory cell as claimed in claim 1, wherein the gate structure comprises a gate oxide layer, a gate layer and a spacer, wherein the gate oxide layer covers the surface of the well region, the gate layer covers the gate oxide layer, and the spacer is arranged beside sidewalls of the gate oxide layer and the gate layer.

6. The memory cell as claimed in claim 5, wherein the protecting layer is contacted with the surface of the well region, and the protecting layer covers a portion of the spacer and a portion of the gate layer.

7. The memory cell as claimed in claim 1, wherein the well region is a P-well region, and the first doped region and the second doped region are n-type doped region.

8. The memory cell as claimed in claim 7, wherein the protecting layer is a salicide block layer or a resist protect oxide layer.

9. The memory cell as claimed in claim 8, wherein the charge trapping layer is a contact etch stop layer.

10. The memory cell as claimed in claim 9, wherein the contact etch stop layer comprises silicon nitride ($Si_3N_4$) or silicon oxynitride (SiON), wherein the dielectric layer is an interlayer dielectric layer.

11. The memory cell as claimed in claim 10, wherein a thickness of protecting layer is in a range between 50 and 500 angstroms, and a thickness of the contact etch stop layer is in a range between 200 and 500 angstroms.

12. The memory cell as claimed in claim 1, wherein the protecting layer, the charge trapping layer and the dielectric layer are collaboratively formed as an oxide/nitride/oxide storage structure.

13. The memory cell as claimed in claim 1, wherein in the well region, an area between the first doped region and the second doped region is a channel region, and the channel region is divided into a first-part channel region and a second-part channel region, wherein an area of the channel region contacted with the surface of the well region and located under the protecting layer is the first-part channel region, and an area of the channel region excluding the first-part channel region is the second-part channel region.

14. The memory cell as claimed in claim 13, wherein a length of the first-part channel region is in a range between ⅓ and ½ of a length of the second-part channel region.

15. The memory cell as claimed in claim 13, wherein a length of the gate structure is approximately equal to a length of the second-part channel region, and a length of the protecting layer that is contacted with the surface of the well region is in a range between ⅓ and ½ of the length of the gate structure.

16. The memory cell as claimed in claim 13, wherein the protecting layer is contacted with the surface of the well region, and the protecting layer covers a portion the gate structure, and wherein a length of the protecting layer projected on the channel region is less than a length of the second-part channel region, and the length of the protecting layer projected on the channel region is greater than a length of the first-part channel region.

17. The memory cell as claimed in claim 13, wherein the first conducting line is a source line, the second conducting line is a bit line, and a gate layer of the gate structure is a word line, wherein when a program action is performed, the source line receives a program voltage, the word line receives a gate voltage, the bit line receives a ground voltage, and the well region receives the ground voltage, wherein the gate voltage is equal to or higher than the program voltage, and the program voltage is higher than the ground voltage.

18. The memory cell as claimed in claim 17, wherein when the program action is performed, a program current flows from the first doped region to the second doped region through the channel region, and a junction between the first-part channel region and the second-part channel region is pinched off, so that plural electrons are injected from a pinch off point into the charge trapping layer through the protecting layer.

19. The memory cell as claimed in claim 13, wherein the first conducting line is a source line, the second conducting line is a bit line, and a gate layer of the gate structure is a word line, wherein when an erase action is performed, the source line receives a ground voltage, the word line receives a negative voltage, the bit line receives a positive voltage, and the well region receives the ground voltage, wherein the positive voltage is an erase voltage.

20. The memory cell as claimed in claim 19, wherein when the erase action is performed, a p-n junction between the well region and second doped region is reverse biased, plural electron-hole pairs are generated by a depletion region, and the plural holes are injected into the charge trapping layer through the protecting layer.

21. The memory cell as claimed in claim 13, wherein the first conducting line is a source line, the second conducting line is a bit line, and a gate layer of the gate structure is a word line, wherein when a read action is performed, the source line receives a ground voltage, the word line receives an on voltage, the bit line receives a read voltage, the well region receives the ground voltage, and a read current is generated between the first doped region and the second doped region.

22. The memory cell as claimed in claim 21, wherein when the read action is performed, a storage state of the memory cell is determined according to a magnitude of the read current and a magnitude of a reference current, wherein if the magnitude of the read current is higher than the magnitude of the reference current, the memory cell is determined to be in a first storage state, wherein if the magnitude of the read current is lower than the magnitude of the reference current, the memory cell is determined to be in a second storage state.

* * * * *